United States Patent
Ho et al.

(10) Patent No.: US 9,196,327 B2
(45) Date of Patent: Nov. 24, 2015

(54) DATA STORAGE DEVICE, STORAGE MEDIA CONTROLLER AND STORAGE MEDIA CONTROL METHOD

(71) Applicant: VIA TECHNOLOGIES, INC., New Taipei (TW)

(72) Inventors: Kuan-Jui Ho, New Taipei (TW); Tsung-Pin Yang, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 208 days.

(21) Appl. No.: 13/940,942

(22) Filed: Jul. 12, 2013

(65) Prior Publication Data

US 2014/0108706 A1    Apr. 17, 2014

(30) Foreign Application Priority Data

Oct. 15, 2012   (TW) .............................. 101137872 A

(51) Int. Cl.
*G11C 7/22*    (2006.01)
*G11C 7/10*    (2006.01)
*G06F 12/02*   (2006.01)

(52) U.S. Cl.
CPC ................ *G11C 7/22* (2013.01); *G11C 7/1072* (2013.01); *G11C 7/1093* (2013.01); *G06F 12/0246* (2013.01)

(58) Field of Classification Search
CPC ............ G06F 11/1471; G06F 12/0246; G06F 13/1689; G11C 7/1072
See application file for complete search history.

(56) References Cited

U.S. PATENT DOCUMENTS

| | | | |
|---|---|---|---|
| 7,457,174 B2 | 11/2008 | Braun et al. | |
| 7,567,880 B2 | 7/2009 | Iizuka | |
| 7,580,301 B2 | 8/2009 | Cheng | |
| 7,590,008 B1 | 9/2009 | Roge et al. | |
| 7,719,904 B2 | 5/2010 | Lee | |
| 7,983,094 B1 | 7/2011 | Roge et al. | |
| 8,737,161 B1* | 5/2014 | Kumar et al. | 365/233.1 |
| 2008/0276112 A1 | 11/2008 | Matsui et al. | |
| 2009/0161453 A1* | 6/2009 | Giovannini et al. | 365/193 |
| 2010/0115324 A1 | 5/2010 | Kuroki | |
| 2011/0063931 A1* | 3/2011 | Linam et al. | 365/193 |
| 2012/0047411 A1* | 2/2012 | Lai et al. | 714/721 |
| 2012/0066445 A1* | 3/2012 | Searles et al. | 711/106 |

* cited by examiner

*Primary Examiner* — Aimee Li
*Assistant Examiner* — Trang Ta
(74) *Attorney, Agent, or Firm* — McClure, Qualey & Rodack, LLP

(57) ABSTRACT

A storage media control method, by which a data strobe signal is shifted by different phase shifts at different time intervals during a write-leveling operation to be received by a storage media and compared to a clock signal for returning a data signal. At the storage media side, during the write-leveling operation, a synchronous transmission between the received data strobe signal and the clock signal causes a transition event at the data signal. The number of transition-event occurrences is counted. When the count shows that just one transition event has occurred over a full round of phase shift tests of the data strobe signal, the phase shift corresponding to the transition event is used in the adjustment of the data strobe signal, which is received by the storage media as the data extraction reference of a write operation.

19 Claims, 5 Drawing Sheets

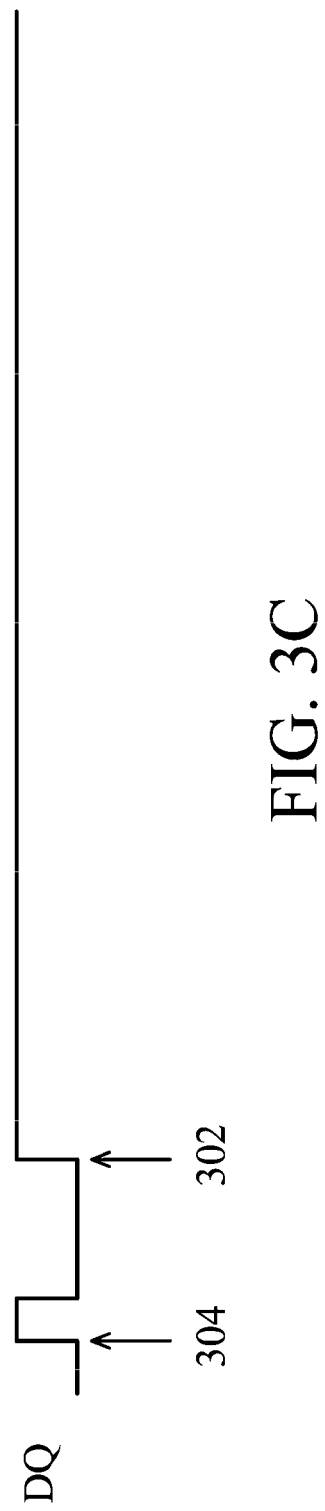

DATA STORAGE DEVICE, STORAGE MEDIA CONTROLLER AND STORAGE MEDIA CONTROL METHOD

CROSS REFERENCE TO RELATED APPLICATIONS

This Application claims priority of Taiwan Patent Application No. 101137872, filed on Oct. 15, 2012, the entirety of which is incorporated by reference herein.

BACKGROUND OF THE INVENTION

1. Field of the Invention

The present invention relates to data storage devices, storage media controllers and storage media control methods.

2. Description of the Related Art

For a storage media with a high data rate, such as a DDR SDRAM abbreviated from Double Data Rate Synchronous Dynamic Random Access Memory, a data strobe signal (e.g. a DQS signal for a DDR) is generally taken into account in the read/write operations of the storage media as well as a clock signal (e.g. a CK signal for a DDR) and a data signal (e.g. a DQ signal for a DDR). The CK signal may be transmitted via a differential pair CK and CK#. The DQS signal may be transmitted via a differential pair DQS and DQS#.

FIG. 1 shows signal waveforms for a write operation of a storage media, including a clock signal CK, a data strobe signal DQS and a data signal DQ. The clock signal CK and the data strobe signal DQS are synchronously triggered at time point Ts and accordingly data is retrieved from the data signal DQ and written into the storage media.

However, when the data rate is increased, a trace length difference on the motherboard between the clock signal CK and the data strobe signal DQS may considerably affect the synchronization between the clock signal CK and the data strobe signal DQS. Especially, when the trigger points observed from the clock signal CK and the data strobe signal DQS are not synchronous to each other, the clock signal CK and the data strobe signal DQS may be received by the storage media asynchronously and thereby the write operations fail.

BRIEF SUMMARY OF THE INVENTION

In the disclosure, a solution for the asynchronous transferred clock signal (CK) and data strobe signal (DQS) is proposed, which performs a write-leveling operation prior to the write operations of a storage media, to adjust the asynchronous situation between the clock signal CK and the data strobe signal DQS at the storage media side.

A data storage device in accordance with an exemplary embodiment of the invention comprises a storage media and a storage media controller. The storage media controller performs a write-leveling operation on the storage media prior to write operations of the storage media. The storage media controller comprises a phase-shift module, a counter and a computing unit. In the write-leveling operation, the phase-shift module provides the storage media with a data strobe signal changing between different phase shifts in different time intervals. In the write-leveling operation, the storage media compares the data strobe signal with a clock signal for generation of a data signal that is returned to the storage media controller. In the data signal returned from the storage media, a transition event occurs every time the storage media detects a synchronization transmission between the data strobe signal and the clock signal. The counter is added to each time the transition event occurs. The computing unit controls the phase-shift module and the counter. When the counter shows that just one transition event has occurred on the data signal during a round of phase shift changing of the data strobe signal, the computing unit determines that the test result of this round of phase shift changing of the data strobe signal is reliable. Thus, the computing unit controls the phase-shift module to adjust the data strobe signal based on the phase shift corresponding to the just one transition event. In this manner, the data strobe signal and the clock signal are received by the storage media synchronously.

The aforementioned storage media controller is considered as an exemplary embodiment of the invention.

Further, in another exemplary embodiment of the invention, a storage media control method is disclosed. According to the method, a write-leveling operation is performed on a storage media to provide the storage media with a data strobe signal changing between different phase shifts in different time intervals. In the write-leveling operation, the storage media compares the data strobe signal with a clock signal for generation of a data signal. In the data signal returned from the storage media, a transition event occurs every time the storage media detects a synchronization transmission between the data strobe signal and the clock signal. The number of occurrences of the transition event is counted. When the count shows that just one transition event has occurred on the data signal during a round of phase shift changing of the data strobe signal, it is determined that the test result of this round of phase shift changing of the data strobe signal is reliable. Thus, the data strobe signal is adjusted based on the phase shift corresponding to the just one transition event. In this manner, the data strobe signal and the clock signal are received by the storage media synchronously.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3B depicts a data strobe signal DQ returned from the storage media during the write-level operation, which shows that the test result is reliable;

FIG. 3C depicts a data strobe signal DQ returned from the storage media during the write level operation, which shows that the test result is unreliable.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
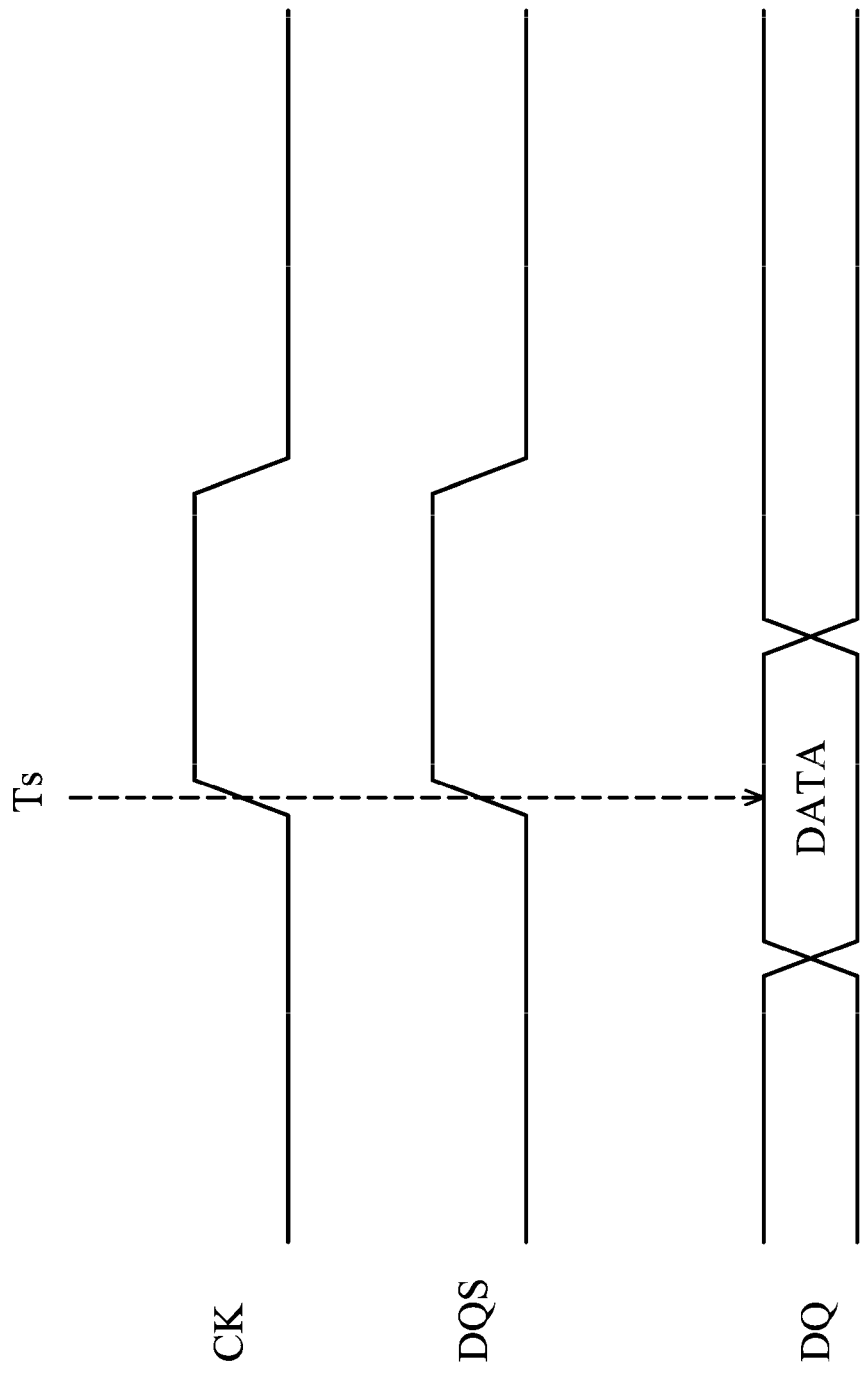
FIG. 1 shows waveforms of a clock signal CK, a data strobe signal DQS and a data signal DQ, which are utilized in a write operation of a storage media.
Figure 2:
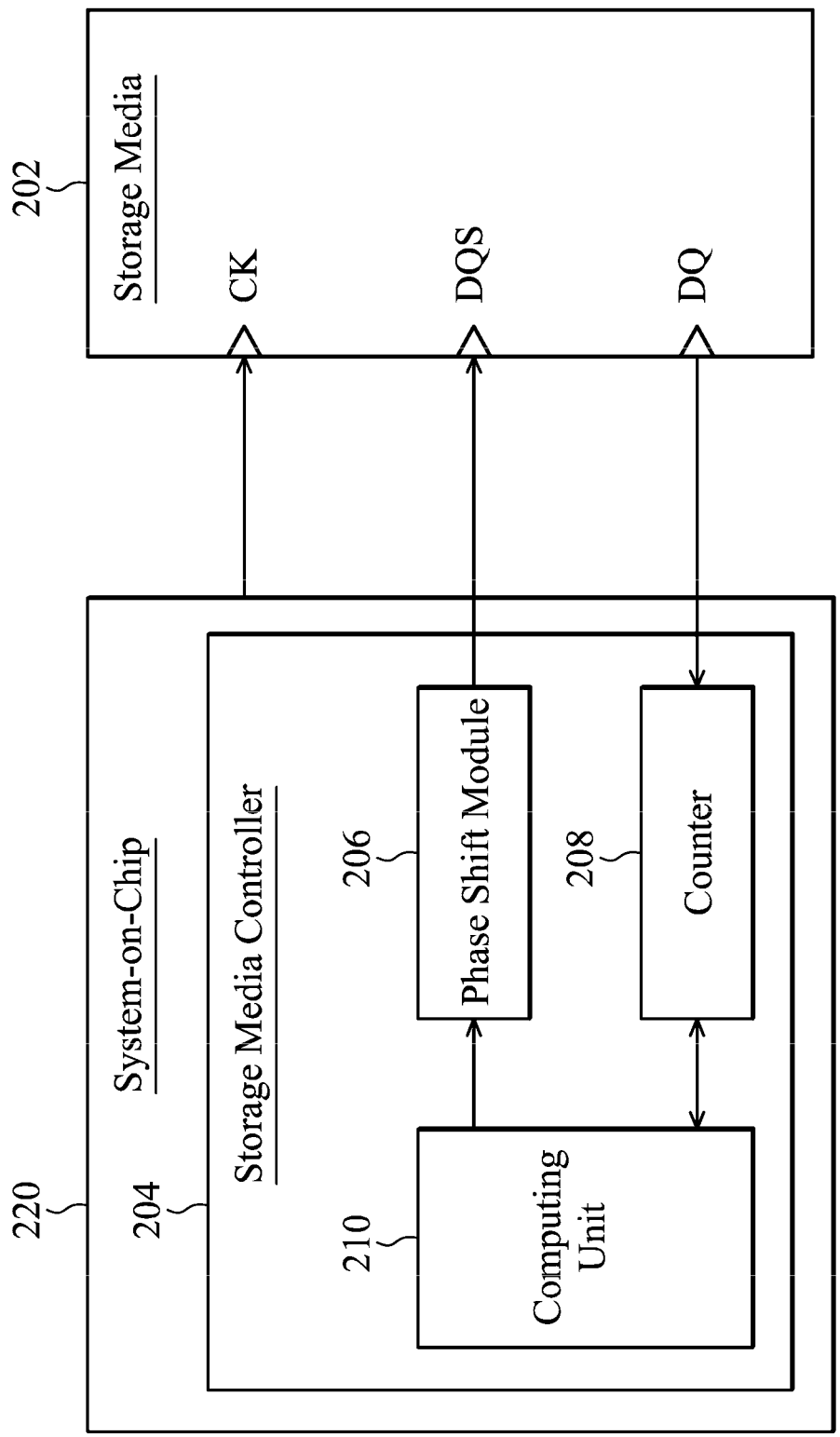
FIG. 2 depicts a data storage device in accordance with an exemplary embodiment of the invention, which comprises a storage media 202 and a storage media controller 204.

FIG. 2 depicts a data storage device in accordance with an exemplary embodiment of the invention, which comprises a storage media 202 and a storage media controller 204.

As shown in FIG. 2, the storage media controller 204 comprises a phase-shift module 206, a counter 208 and a computing unit 210. The storage media controller 204 may perform a write-leveling operation on the storage media 202.

The phase-shift module 206 provides the storage media 202 with a data strobe signal changing between different phase shifts at different time intervals during the write-leveling operation. For example, during the write-leveling operation, the phase-shift module 206 may change a data strobe signal by all possible phase shifts within one time unit (e.g. within one cycle T of the clock signal CK), to be tested by the storage media 202. Further, according to the disclosure, the pin DQS of the storage media 202 is operative to receive the data strobe signal changing between different phase shifts. Note that in the specification the data strobe signal is labeled as DQS as well. During the write-leveling operation, the storage media 202 receives the data strobe signal DQS as well as a clock signal CK, and compares the data strobe signal DQS with the clock signal CK for generation of a data signal DQ which is returned to the storage media controller 204. Note that the clock signal CK is received by the storage media 202 by a pin CK (labeled the same as the clock signal CK) of the storage media 202 and the data signal DQ is output from a pin DQ (labeled the same as the data signal DQ) of the storage media 202. During the write-leveling operation, when it is determined that the data strobe signal DQS and the clock signal CK are synchronously received by the storage media 202 (e.g., at the moment that the storage media 202 detects that the data strobe signal DQS and the clock signal CK transit from 0 to 1 synchronously,) a transition event (a '0' to '1' transition) occurs on the data signal DQ accordingly. The transition-event occurrences on the data signal DQ may be counted by the counter 208. The computing unit 210 is operative to control the phase-shift module 206 and the counter 208. When the counter 208 shows that just one transition event (transition from '0' to '1') occurs on the data signal DQ during a round of phase shift changing of the data strobe signal DQS, the computing unit 210 may determine that the test result of this round of phase shift changing of the data strobe signal DQS is reliable. According to the reliable test result, the phase-shift module 206 is controlled to generate the data strobe signal DQS based on the phase shift corresponding to the just one transition event on the data signal DQ, and thereby the data strobe signal DQS is synchronized with the clock signal CK. By counting the transition-event occurrences, the erroneous transitions on the data signal DQ due to unknown reasons are not erroneously referred to in adjusting the data strobe signal DQS. Consequently, the data strobe signal DQS and the clock signal CK are adjusted to real synchronization. No erroneous adjustment is made to the data strobe signal DQS. A write-leveling operation with trustable reliability is introduced.

Figure 3A:
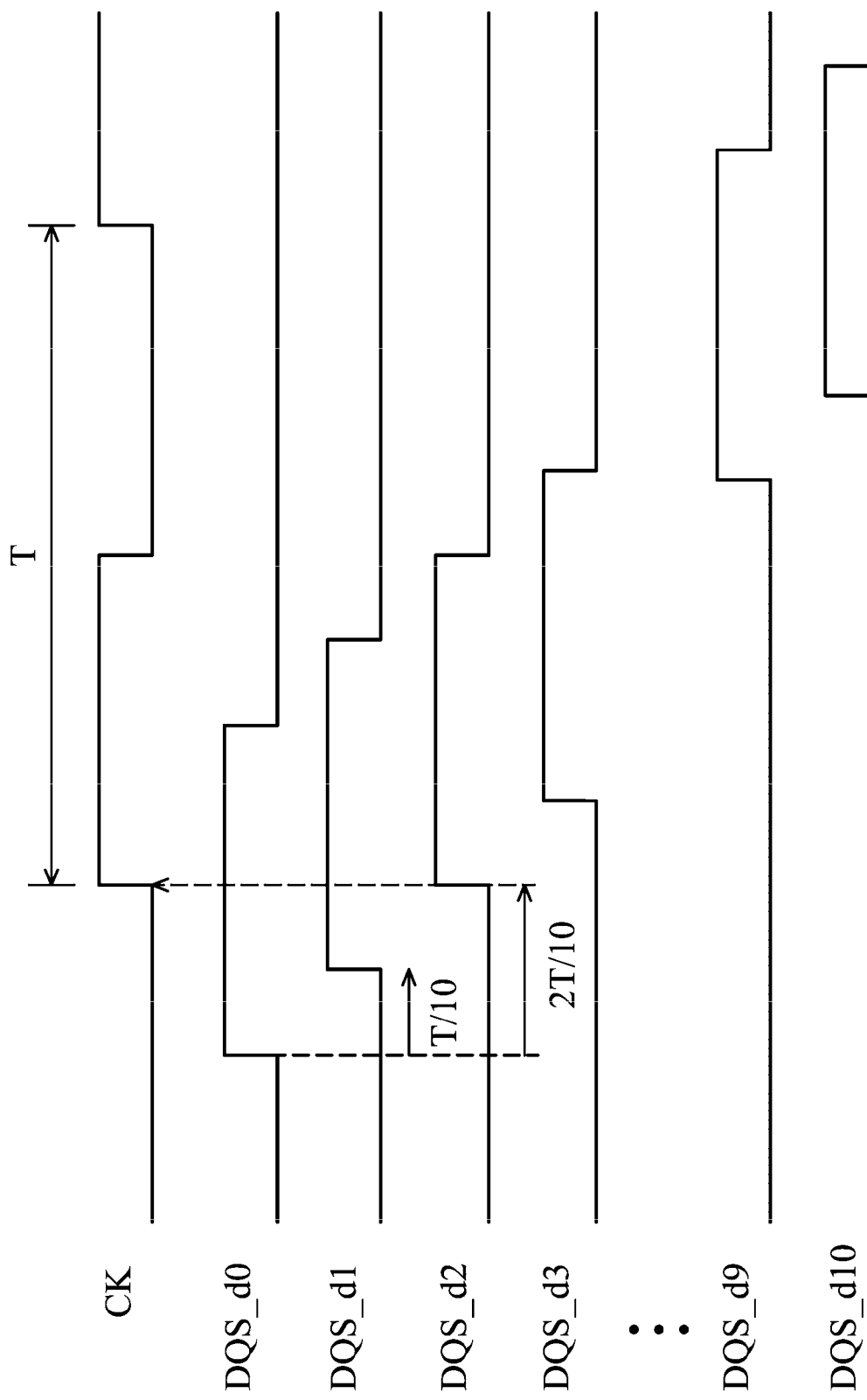
FIG. 3A shows waveforms of a clock signal CK and different phase-shifted data strobe signals DQS_d0, DQS_d1, DQS_d2, DQS_d3 ... DQS_d9 and DQS_d10 which are provided at different time intervals to be compared to the clock signal CK.

In accordance with an exemplary embodiment of the invention, FIG. 3A shows waveforms of the clock signal CK and phase-shifted data strobe signals DQS_d0, DQS_d1, DQS_d2, DQS_d3 . . . DQS_d9 and DQS_d10, which are required in a write-leveling operation. The phase-shifted data strobe signals DQS_d0 to DQS_d10, in fact, are supplied at different time intervals (e.g., in different clock cycles). However, for easy drawing, the phase-shifted data strobe signals DQS_d0 to DQS_d10 are shown together in FIG. 3A, wherein the phase differences of the phase-shifted data strobe signals DQS_d0 to DQS_d10 are shown with respect to the clock signal CK.

In FIG. 3A, a clock cycle T of the clock signal CK is divided by ten. The unit for phase shift is T/10. With respect to the clock signal CK, phase-shifted data strobe signals DQS_d0 to DQS_d10 with ten different phase shifts are shown. The phase-shifted data strobe signals DQS_d0 to DQS_d10 are transmitted to the storage media 202 in different clock cycles of the clock signal CK and are compared with the clock signal CK, respectively. During the write-leveling operation, the storage media 202 controls the data signal DQ to respond to the synchronization between the clock signal CK and the phase-shifted data strobe signals DQS_d0 to DQS_d10. When any of the phase-shifted data strobe signals DQS_d0 to DQS_d10 changes from '0' to '1' in synchrony with the clock signal CK, the data signal DQ is changed from "0" to "1". With respect to FIG. 3A, when a data strobe signal changes from "0" to "1" in synchrony with the clock signal CK, it means that the rising edge of the data strobe signal is aligned to a rising edge of the clock signal CK.

In the example shown in FIG. 3A, the data strobe signal shifted by two phase shift units 2T/10 (DQS_d2) changes from '0' to '1' in synchrony with the clock signal CK. Ideally, as shown in FIG. 3B, during a round of synchronization test (i.e., tested by all possible phase-shifted data strobe signals DQS_d0 to DQS_d10), just one '0' to '1' transition 302 (i.e. a rising edge) occurs on the data signal DQ. However, in an actual operating environment, erroneous '0' to '1' transitions may occur on the data signal DQ, e.g. the erroneous transition 304 shown in FIG. 3C, because of the complex circuit design or the high data rate. By counting the number of '0' to '1' transitions of the data signal DQ in accordance with the disclosure, the erroneous test result of FIG. 3C (with more than one '0' to '1' transition on the data signal DQ) is not adopted, and, the DQ waveform of FIG. 3B is regarded as showing a reliable test result. According to the phase-shifted data strobe signal DQS_d2 corresponding to the transition 302 of FIG. 3B, the two phase shift units 2T/10 is adopted in data strobe signal adjustment, and thereby the storage media 202 receive the data strobe signal (DQS_d2) and the clock signal CK synchronously. The synchronization test (i.e., tested by all possible phase-shifted data strobe signals DQS_d0 to DQS_d10) is repeated until just one '0' to '1' transition occurs on the data signal DQ during a test round. A test result containing more than one '0' to '1' transition on the data signal DQ is regarded as unreliable.

After a device is switched from a write-leveling operation to a write operation, the data signal DQ is switched to transfer data into the storage media 202. The storage media 202 retrieves data correctly from the data signal DQ according to the clock signal CK and the data strobe signal DQS_d2. In conclusion, according to the disclosure, a write-leveling operation is performed prior to the write operations of the data storage device. In this manner, write data is correctly retrieved and written into the storage media 202. In some exemplary embodiments, the write-leveling operation is performed in an initialization step during the start up of the entire system.

In an exemplary embodiment, the storage media 202 is a dynamic random access memory, such as a Double Data Rate Synchronous Dynamic Random Access Memory (abbreviated as DDR). A DDR3 in particular.

In another exemplary embodiment, the storage media 202 is a FLASH memory, such as a NAND FLASH.

In some exemplary embodiments, data is retrieved from the data signal DQ according to synchronous '1' to '0' transitions (falling edges) of the clock signal CK and data strobe signal DQS rather than '0' to '1' transitions.

Further, referring to FIG. 2, the storage media controller 204 may be arranged within an SoC (System-on-Chip) 220 or into a north bridge chip.

In some exemplary embodiments, the computing unit 210 may execute firmware to control the phase-shift module 206 and the counter 208. In another exemplary embodiment, there are hardware elements provided within the storage media controller 204 to control the phase-shift module 206 and the counter 208.

Figure 4:
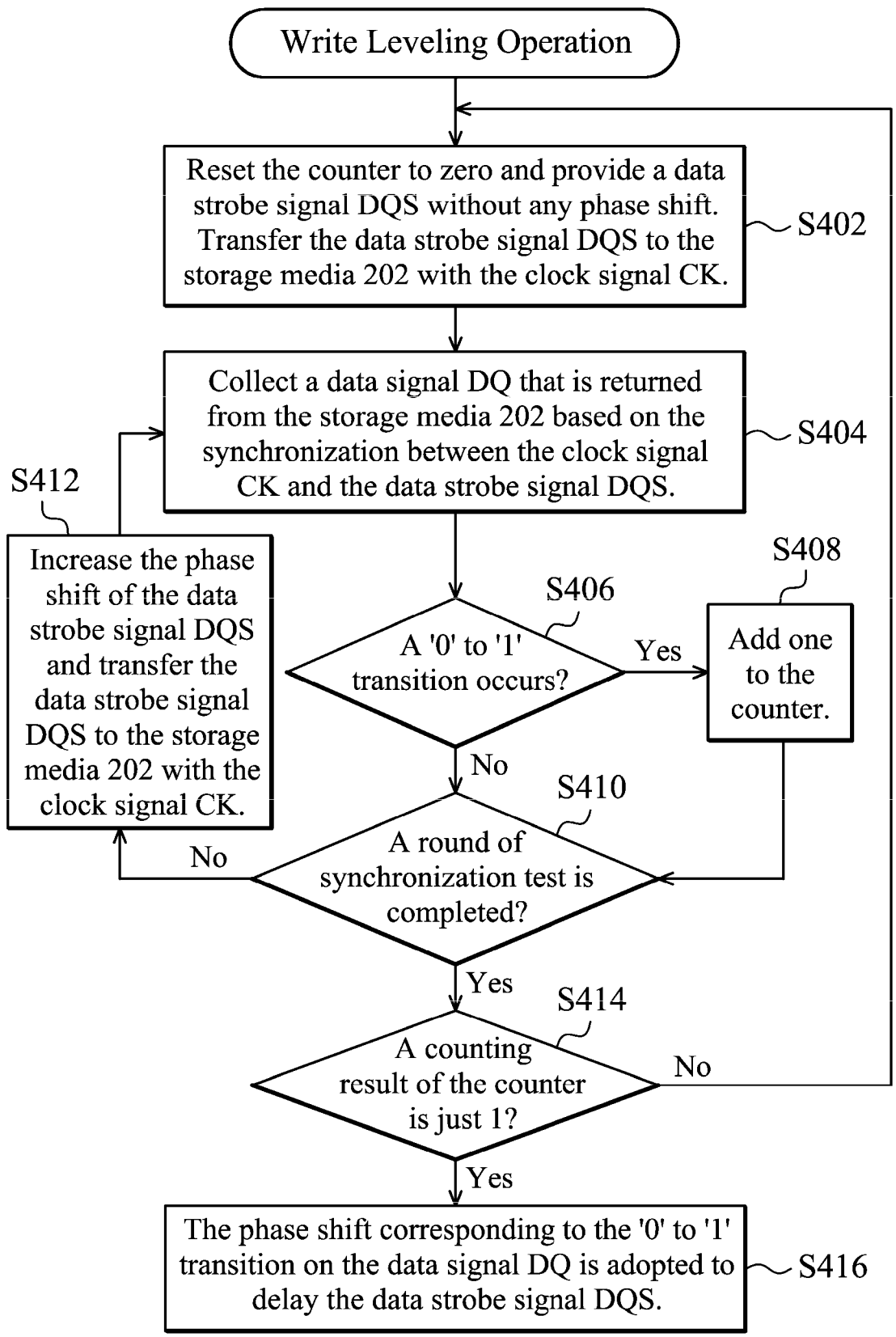
FIG. 4 is a flowchart depicting a write-leveling operation for the storage media 202 in accordance with an exemplary embodiment of the invention.

FIG. 4 is a flowchart depicting a write-leveling operation for the storage media 202 in accordance with an exemplary embodiment of the invention. In step S402, the counter 208 is reset to zero and the data strobe signal DQS is tested without phase shift. The storage media 202 receives the data strobe signal DQS and the clock signal CK both. In step S404, a data signal DQ is returned from the storage media 202 based on the synchronization between the clock signal CK and the data strobe signal DQS. In step S406, it is determined whether any '0' to '1' transition occurs on the data signal DQ. Every time a '0' to '1' transition is detected from the data signal DQ, step S408 is performed to add one to the counter 208. When no '0' to '1' transition is detected from the data signal DQ in step S406, step S410 is performed to check whether a round of synchronization test is completed (e.g. all possible phased shifts of the data strobe signal DQS are tested). If not, step S412 is performed to increase the phase shift of the data strobe signal DQS. The data strobe signal DQS with increased phase shift is received by the storage media 202 with the clock signal CK and step S404 is performed again to determine whether the phase shifted data strobe signal DQS is synchronously received by the storage media 202 with the clock signal CK. When it is determined in step S410 that all possible phase shifts of the data strobe signal DSQ have been tested, step S414 is performed to check whether the count of the counter is just 1. When the count is greater than 1, step S402 is performed again for a new round of synchronization test. When it is determined in step S414 that the count is 1, step S416 is performed and the proper phase shift obtained during the round of synchronization test is adopted to delay the data strobe signal DQS. In this manner, the data strobe signal DQS and the clock signal CK are transferred to the storage media 202 synchronously.

In another exemplary embodiment of the invention, a control method for the storage media 202 is shown. According to the disclosed control method, during a write-leveling operation, the storage media 202 is provided with a data strobe signal DQS changing between different phase shifts at different time intervals and compares the data strobe signal DQS to a clock signal CK for generation of a data signal DQ. During the write-leveling operation, a transition event (e.g. a '0' to '1' transition) occurs on the data signal DQ every time the clock signal CK and the data strobe signal DQS are transferred to the storage media 202 synchronously. The number of transition-event occurrences is counted. When the count shows that just one transition event has occurred on the data signal DQ, the phase shift of the data strobe signal DQS corresponding to the transition event is adopted to actually delay the data strobe signal DQS. In this manner, the data strobe signal DQS and the clock signal CK are transferred to the storage media 202 synchronously.

As for performing a write operation on the storage media 202, the control method for the storage media 202 provides the following steps: transmitting the clock signal CK and the properly phase-shifted data strobe signal DQS to the storage media 202; and, based on the synchronous triggers between the clock signal CK and the data strobe signal DQS, the data conveyed on the data signal DQ is retrieved therefrom.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a storage media; and
   a storage media controller, performing a write-leveling operation on the storage media, wherein the storage media controller comprises:
   a phase-shift module, wherein during the write-leveling operation the phase-shift module provides the storage media with a data strobe signal changing between different phase shifts at different time intervals to be compared with a clock signal for generation of a data signal that is returned to the storage media controller and on which a transition event occurs every time the storage media detects a synchronization transmission between the data strobe signal and the clock signal;
   a counter, counting the number of occurrences of the transition event during the write-leveling operation; and
   a computing unit controlling the phase-shift module and the counter,
   wherein:
   when the counter shows that the transition event has occurred on the data signal returned from the storage media only once during the write-leveling operation, the computing unit controls the phase-shift module to adjust the data strobe signal based on the phase shift corresponding to the transition event; and
   when the counter shows that the transition event has occurred on the data signal not once during the write-leveling operation, the storage media controller resets the counter and restarts the write-leveling operation.

2. The data storage device as claimed in claim 1, wherein in a write operation, the storage media retrieves data from the data signal based on the synchronous triggers of the data strobe signal and the clock signal.

3. The data storage device as claimed in claim 1, wherein the storage media is a Double Data Rate Synchronous Dynamic Random Access Memory.

4. The data storage device as claimed in claim 1, wherein the storage media is a FLASH memory.

5. The data storage device as claimed in claim 1, wherein the storage media controller is arranged within a north bridge chip.

6. The data storage device as claimed in claim 1, wherein the storage media controller is arranged within a system-on-chip.

7. The data storage device as claimed in claim 1, wherein when the data strobe signal and the clock signal are synchronously transferred to the storage media, a rising edge of the data strobe signal is aligned with a rising edge of the clock signal.

8. A storage media controller, comprising:
   a phase-shift module, wherein during a write-leveling operation the phase module provides a storage media with a data strobe signal changing between different phase shifts at different time intervals to be compared with a clock signal for generation of a data signal that is returned to the storage media controller and on which a transition event occurs every time the storage media detects a synchronization transmission between the data strobe signal and the clock signal;

a counter, counting the number of occurrences of the transition event during the write-leveling operation; and a computing unit controlling the phase-shift module and the counter, wherein:

when the counter shows that the transition event has occurred on the data signal returned from the storage media only once during the write-leveling operation, the computing unit controls the phase-shift module to adjust the data strobe signal based on the phase shift corresponding to the transition event; and when the counter shows that the transition event has occurred on the data signal not once during the write-leveling operation, the storage media controller resets the counter and restarts the write-leveling operation.

9. The storage media controller as claimed in claim 8, wherein:

during a write operation, the storage media controller provides the storage media with the adjusted data strobe signal and the clock signal and conveys data to the storage media via the data signal, and thereby the storage media retrieves the data from the data signal based on synchronous triggers of the adjusted data strobe signal and the clock signal.

10. The storage media controller as claimed in claim 8, wherein the storage media controlled thereby is a Double Data Rate Synchronous Dynamic Random Access Memory.

11. The storage media controller as claimed in claim 8, wherein the storage media controlled thereby is a FLASH memory.

12. The storage media controller as claimed in claim 8, arranged within a north bridge chip.

13. The storage media controller as claimed in claim 8, arranged within a system-on-chip.

14. The storage media controller as claimed in claim 8, wherein when the data strobe signal and the clock signal are synchronously transferred to the storage media, a rising edge of the data strobe signal is aligned with a rising edge of the clock signal.

15. A control method for a storage media, comprising:

during a write-leveling operation of a storage media, providing the storage media with a data strobe signal changing between different phase shifts at different time intervals to be compared with a clock signal for generation of a data signal, wherein, in the data signal returned from the storage media, a transition event occurs every time the storage media detects a synchronization transmission between the data strobe signal and the clock signal;

using a counter to count the number of occurrences of the transition event during the write-leveling operation;

when the counter shows that the transition event has occurred on the data signal returned from the storage media only once during the write-leveling operation, adjusting the data strobe signal based on the phase shift corresponding to the transition event; and when the counter shows that the transition event has occurred on the data signal not once during the write-leveling operation, resetting the counter and restarting the write-leveling operation.

16. The control method as claimed in claim 15, further comprising:

when performing a write operation on the storage media, providing the storage media with the adjusted data strobe signal and the clock signal and conveying data to the storage media via the data signal, and controlling the storage media to retrieve the data from the data signal based on synchronous triggers of the adjusted data strobe signal and the clock signal.

17. The control method as claimed in claim 15, wherein the storage media controlled thereby is a Double Data Rate Synchronous Dynamic Random Access Memory.

18. The control method as claimed in claim 15, wherein the storage media controlled thereby is a FLASH memory.

19. The control method as claimed in claim 15, wherein when the data strobe signal and the clock signal are synchronously transferred to the storage media, a rising edge of the data strobe signal is aligned with a rising edge of the clock signal.

\* \* \* \* \*